(12) United States Patent
Wybenga et al.

(10) Patent No.: US 7,440,460 B2
(45) Date of Patent: Oct. 21, 2008

(54) APPARATUS AND METHOD FOR FORWARDING MIXED DATA PACKET TYPES IN A HIGH-SPEED ROUTER

(75) Inventors: Jack C. Wybenga, Plano, TX (US);
Patrick W. Ireland, Sanger, TX (US);
Patricia K. Sturm, McKinney, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 851 days.

(21) Appl. No.: 10/794,506

(22) Filed: Mar. 5, 2004

(65) Prior Publication Data

US 2005/0195831 A1    Sep. 8, 2005

(51) Int. Cl.
*H04L 12/28* (2006.01)
*H04L 12/54* (2006.01)

(52) U.S. Cl. .................................. 370/395.31; 370/428
(58) Field of Classification Search ............ 370/395.31, 370/395.32, 395.42, 395.7–395.72, 392, 370/401, 428, 429
See application file for complete search history.

(56) References Cited

U.S. PATENT DOCUMENTS

| 5,938,736 A * | 8/1999 | Muller et al. ............... 709/243 |
| 6,192,051 B1 * | 2/2001 | Lipman et al. .............. 370/389 |
| 6,606,681 B1 * | 8/2003 | Uzun ......................... 711/108 |
| 6,876,655 B1 * | 4/2005 | Afek et al. .................. 370/392 |
| 7,075,932 B2 * | 7/2006 | Matsuhira et al. ...... 370/395.31 |
| 7,158,519 B2 * | 1/2007 | Kanakubo ................... 370/392 |
| 7,286,535 B2 * | 10/2007 | Ishikawa et al. ............ 370/392 |
| 2002/0126672 A1 * | 9/2002 | Chow et al. ................. 370/392 |
| 2003/0012198 A1 * | 1/2003 | Kaganoi et al. ............. 370/392 |
| 2003/0048785 A1 * | 3/2003 | Calvignac et al. .......... 370/392 |
| 2003/0053460 A1 * | 3/2003 | Suda et al. .................. 370/392 |
| 2003/0058864 A1 * | 3/2003 | Michels et al. ............. 370/392 |
| 2004/0109451 A1 * | 6/2004 | Huang et al. ................ 370/392 |
| 2004/0223502 A1 * | 11/2004 | Wybenga et al. ........... 370/401 |
| 2005/0055457 A1 * | 3/2005 | Wybenga et al. ........... 709/238 |

* cited by examiner

*Primary Examiner*—Kwang Bin Yao
*Assistant Examiner*—Candal Elpenord

(57) ABSTRACT

A routing table search circuit comprising a forwarding table containing forwarding table entries, each forwarding table entry comprising a destination address, and a content addressable memory (CAM) comprising a CAM lookup table, the CAM receiving a search key and outputting a CAM search result corresponding to the search key from the CAM lookup table. The search key comprises at least: i) a packet type field associated with the first received address and ii) an address field containing a most significant bits portion of the first received address. The routing table search circuit also comprises M pipelined memory stages for storing a trie table that translates the first received address into the first destination address. The M pipelined memory stages are searched using the CAM search result and a remaining bits portion of the first received address. Each of the M pipelined memory stages outputs a stage search result.

24 Claims, 4 Drawing Sheets

APPARATUS AND METHOD FOR FORWARDING MIXED DATA PACKET TYPES IN A HIGH-SPEED ROUTER

CROSS-REFERENCE TO RELATED APPLICATIONS

The present invention is related to those disclosed in:
1) U.S. patent application Ser. No. 10/431,770, entitled "APPARATUS AND METHOD FOR COMBINING FORWARDING TABLES IN A DISTRIBUTED ARCHITECTURE ROUTER," filed May 8, 2003;
2) U.S. patent application Ser. No. 10/665,192, entitled "APPARATUS AND METHOD FOR CLASSIFYING TRAFFIC IN A DISTRIBUTED ARCHITECTURE ROUTER," filed Sep. 4, 2003; and
3) U.S. patent application Ser. No. 10/658,977, entitled "APPARATUS AND METHOD FOR PERFORMING HIGH-SPEED LOOKUPS IN A ROUTING TABLE," filed Sep. 10, 2003.

Patent application Ser. Nos. 10/431,770, 10/665,192 and 10/658,977 are assigned to the assignee of the present application. The subject matter disclosed in each of patent application Ser. Nos. 10/431,770, 10/665,192 and 10/658,977 is hereby incorporated by reference into the present disclosure as if fully set forth herein.

TECHNICAL FIELD OF THE INVENTION

The invention relates to massively parallel routers and, more specifically, to an apparatus and method for forwarding mixed data packet types (e.g., IPv4, IPv6) at high-speed line rates in a massively parallel, distributed architecture router.

BACKGROUND OF THE INVENTION

There has been explosive growth in Internet traffic due to the increased number of Internet users, various service demands from those users, the implementation of new services, such as voice-over-IP (VoIP) or streaming applications, and the development of mobile Internet. Conventional routers, which act as relaying nodes connected to sub-networks or other routers, have accomplished their roles well, in situations in which the time required to process packets, determine their destinations, and forward the packets to the destinations is usually smaller than the transmission time on network paths. More recently, however, the packet transmission capabilities of high-bandwidth network paths and the increases in Internet traffic have combined to outpace the processing capacities of conventional routers.

This has led to the development of a new generation of massively parallel, distributed architecture routers. A distributed architecture router typically comprises a large number of routing nodes that are coupled to each other via a plurality of switch fabric modules and an optional crossbar switch. Each routing node has its own routing (or forwarding) table for forwarding data packets via other routing nodes to a destination address.

When a data packet arrives in a conventional routing node, a forwarding engine in the routing node uses forwarding tables to determine the destination of the data packet. A conventional Internet Protocol (IP) router uses a dedicated forwarding table for each type of traffic, such as Internet Protocol version 4 (IPv4), Internet Protocol version 6 (IPv6) and MPLS.

However, conventional routing tables have severe limitations. Using separate forwarding engines and forwarding processes with independent forwarding tables for each packet type is inefficient in terms of computing resources and memory utilization. It is desirable to eliminate separate lookup tables for each type of traffic, so that a single lookup (i.e., forwarding) table may forward mixed data packet types. Moreover, conventional routing tables are best suited for relatively lower speed routers (i.e., 100 Mbps or less) and for relatively small address sizes (i.e., 32 bits or less). It also is desirable to allow packet forwarding based on class of service (CoS) and/or higher layer protocols.

Performing an IPv6 forwarding table lookup at high-speed line rates (e.g., 10 Gbps) is a challenge because of the large address range (128-bit addresses). There currently is not a practical method for doing IPv6 lookups at line speed for high-speed interfaces (e.g., 10 Gbps routers). Current proposals use TCAM memory devices to increase lookup speed, but doing the entire search in TCAM is not practical due to the expense and high power consumption of TCAM devices. Also, hashing and state of the art searching techniques are not adequate because it is necessary 1) to keep tables within a reasonable size limit for cost and performance considerations and 2) to keep the number of lookup stages low enough that memory access time does not prevent the lookup speeds from keeping up with line speeds.

The assignee of the present application has submitted three related patent applications directed to solving some of these problems. These three applications are: 1) U.S. patent application Ser. No. 10/431,770, entitled "Apparatus and Method for Combining Forwarding Tables in a Distributed Architecture Router," filed on May 8, 2003; 2) U.S. patent application Ser. No. 10/665,192, entitled "Apparatus and Method for Classifying Traffic in a Distributed Architecture Router," filed on Sep. 4, 2003; and 3) U.S. patent application Ser. No. 10/658,977, entitled "Apparatus and Method for Performing High-Speed Lookups in a Routing Table," filed on Sep. 10, 2003. U.S. patent application Ser. Nos. 10/431,770, 10/665,192 and 10/658,977 were previously incorporated by reference into the present application.

Each of these solves some of the problems of large forwarding table indices and large numbers of routes. U.S. patent application Ser. Nos. 10/431,770 and 10/665,192 are suitable for use in 1 Gbps routers and provide an adequate solution for line rates up to 1 Gbps. U.S. patent application Ser. No. 10/658,977 provides a solution for line rates up to 10 Gbps. The present application expands upon the ideas in U.S. patent application Ser. Nos. 10/431,770, 10/665,192 and 10/658,977.

U.S. patent application Ser. No. 10/431,770 solved the problems of dealing with three large tables and of the complexity of dealing with three separate forwarding tables for IPv4, IPv6, and Multiprotocol Label Switching (MPLS) by folding these into a single forwarding table. U.S. patent application Ser. No. 10/431,770 disclosed the use of address space sharing between IPv4 and MPLS and the tunneling of IPv6 data packets. A classification engine based on state graph technology was used to compress the IPv6 address into the address to be tunneled and a CAM was used to speed the lookup. The approach disclosed in U.S. patent application Ser. No. 10/431,770 differs from traditional uses of CAMs in that the classification engine allowed the fields in the lookup index to vary on a packet-by-packet basis determined by packet contents, instead of using fixed bit fields. However, the method disclosed in U.S. patent application Ser. No. 10/431,770 is less suitable for use in a 10 Gbps router, because classification engines are not available that operate at the 10 Gbps line rate.

U.S. patent application Ser. No. 10/665,192 extended the use of the classification engine to add new functionality to routers. U.S. patent application Ser. No. 10/665,192 disclosed the modification of the data packet in the forwarding process, thereby enabling the new functionality. The new functionality included: 1) providing security in the form of user anonymity by translating Layer 2 and Layer 3 addresses in the classification engine; 2) providing support for Network Address Translation (leading to configuration independence); and 3) enabling forwarding based on Layer 2 through Layer 7 information, instead of Layer 3 forwarding only. U.S. patent application Ser. No. 10/665,192 also provided support for content-based billing, firewall functionality, and data surveillance capabilities at the router core instead of at a host computer.

U.S. patent application Ser. No. 10/658,977 disclosed a new apparatus and method for forwarding IPv6 data packets at high-speed line rates (e.g., 10 Gbps). U.S. patent application Ser. No. 10/658,977 abandoned the use of classification engines because conventional classification engines cannot operate at 10 Gbps. U.S. patent application Ser. No. 10/658,977 expanded on the prior art by compacting the search tables to fit within practical SRAM sizes while allowing the final lookup stage to use DRAM, by combining the compacted search tables with pipelined hardware lookup support, and by including an initial CAM-based hashing technique into multiple trie trees to narrow the lookup width in the trie search.

However, the apparatus and method disclosed in U.S. patent application Ser. No. 10/658,977 are suitable for homogeneous packet types where the important fields do not change from packet to packet, but are less suitable for mixed data packet types, where the important fields change from packet to packet. The nature of the pipelining is such that each stage of the pipeline acts upon every packet. If a packet does not need the processing of a pipeline stage, then the resources of that pipeline stage are idle when the packet traverses that stage.

Therefore, there is a need in the art for an improved router that does not suffer from the above-described problems associated with the prior art. In particular, there is a need for a distributed router that is capable of forwarding mixed types of data packets at high-speed lines rates, such as 1 gigabits per second (Gbps) and higher. More particularly, there is a need for a distributed router that forwards mixed data packets at high line rates without using large amounts of content addressable memory (CAM). Still more particularly, there is a need for a distributed router that forwards mixed data packets at high line rates without using classification engines.

SUMMARY OF THE INVENTION

The present invention differs from the invention disclosed in U.S. patent application Ser. No. 10/431,770 in two important aspects. The present invention does not require a classification engine and does not involve IPv6 data packet tunneling. The present invention does provide unification of the three forwarding tables. The present invention is similar to U.S. patent application Ser. No. 10/665,192 in that the present invention also forwards data packets based on higher layer protocols and class of service (CoS). However, the present invention differs from U.S. patent application Ser. No. 10/665,192 in that the present invention does not use classification engines. The present invention also differs from U.S. patent application Ser. No. 10/665,192 in that the present invention does not use CAMs in the tunneling process, although it does use smaller, cheaper CAMs in the search stage. The present invention expands on U.S. patent application Ser. No. 10/658,977 by using a multi-threaded processing approach instead of a strict pipelining approach and by disclosing a new unifying CAM-based hashing method that supports mixed packet types.

The present invention introduces parallelism into the longest prefix match forwarding table lookup process, which is historically a serial process. It allows pipelining to be used in simple traversal of the tree structure, while allowing multi-threaded processing to handle multiple packets simultaneously and to handle unique packet processing. The present invention uses a combination of content addressable memory (CAM) and trie tree lookup tables to forward mixed packet types at high line rates. The mixed packet types are handled by building the lookup key. The building of a common lookup string format for all packet types enables a pipelining approach to be used for the tree search. A packet type field in the search key is used to identify the packet type. In an exemplary embodiment of the present invention, this field is 4 bits and has predefined values for IPv4, IPv6, and MPLS. Other fields may be defined in the search key to further refine the lookup. In an exemplary embodiment of the present invention, the entire 20-bit tag is used for MPLS, while IPv4 and IPv6 use the 16 most significant bits of the destination address, along with an optional 4 bits of Class of Service (CoS) information.

In each case, the search string used by the exemplary router for the CAM search stage is 24 bits, with the CoS bits set to zero if forwarding based on class of service is not desired. The first stage of the lookup is a CAM search stage that uses the search key and the result of the CAM search is a pointer to the start of a search tree. In an exemplary embodiment of the router, a 32-bit address width is used for the memory pointers into tables and a trie tree search mechanism is used. The remaining stages of the lookup circuit perform a tree search on additional information from the incoming packet.

In the exemplary embodiment of the router, MPLS forwarding is fully resolved in the first stage lookup, so that the result of the CAM search is a pointer into the forwarding table. For IPv4 and IPv6 data packets, the lookup may be fully resolved by the first stage lookup in some cases. However, in most cases, the lookup will require more of the IPv4 and IPv6 destination address bits to be used to find the forwarding entry. IPv4 addresses are 32 bits long, so there are 16 bits left to process after the first CAM stage. IPv6 addresses are 128 bits long, so there are 112 bits left to process after the first CAM stage.

In the tree lookup, the remaining bits are grouped into symbols that may be any size from 1 to M, where M is the maximum bits available. In an exemplary embodiment of the present invention, each remaining stage operates from a symbol containing 4 address bits (i.e., symbol size=S=4). The value of the next symbol is added to the base address output from the previous search stage to index into a table.

Both the stage n tables and the CAM lookup result may contain: 1) an address pointer to the next stage of the lookup; 2) a code indicating "No Match"; or 3) an address pointer to a forwarding table entry. If the table contains a forwarding table pointer, the data packet is forwarded accordingly. If the table contains an invalid address, the data packet is dropped and an error may be reported to the control plane. Optionally, the packet may be forwarded to the control plane processor designated to handle unknown routes. If the table contains a pointer to another search table, the next symbol is used along with the table pointer to continue the search.

The search continues until all bits are consumed or until an entry in a forwarding table is found. The subnet mask is used when constructing the table to determine how many bits are used in the search and thus to determine where to mark the end of the search and place a forwarding table pointer. Advantageously, the present invention is simple enough to be implemented in a pipelined architecture by folding the packet types into a common search string structure, but also lends itself to a multi-threaded implementation to allow efficient handling of unique processing for heterogeneous packet types.

Accordingly, to address the above-discussed deficiencies of the prior art, it is a primary object of the present invention to provide, for use in a router, a routing table search circuit for determining a first destination addresses for a first received data packet. According to an advantageous embodiment of the present invention, the routing table search circuit comprises: 1) a forwarding table comprising a plurality of forwarding table entries, each of the forwarding table entries comprising a destination address; 2) a content addressable memory (CAM) comprising a CAM lookup table, the CAM capable of receiving a search key and outputting a CAM search result corresponding to the search key from the CAM lookup table, wherein the search key comprises at least: i) a packet type field associated with the first received data packet and ii) an address field containing a most significant bits portion of a first received address associated with said first received data packet; and 3) M pipelined memory stages for storing a trie table capable of translating header information from the first received packet into the first destination address, wherein the M pipelined memory stages are searched using the CAM search result and a remaining bits portion of the first received address, wherein each of the M pipelined memory stages outputs a stage search result.

According to one embodiment of the present invention, the packet type field indicates if the first received address corresponds to one of an MPLS tag, an IPv4 address and an IPv6 address.

According to another embodiment of the present invention, the search key further comprises a class of service (CoS) field indicating a class of service for a data packet associated with the first received data packet.

According to still another embodiment of the present invention, the most significant bits portion of the first received address comprises at least a portion of an MPLS tag.

According to a yet another embodiment of the present invention, the CAM result accesses in the forwarding table a destination address corresponding to the MPLS tag.

According to a further embodiment of the present invention, the most significant bits portion of the first received address comprises at least a portion of one of: 1) an IPv4 address and 2) an IPv6 address.

According to a still further embodiment of the present invention, the first stage result associated with a first one the M pipelined memory stages accesses in the forwarding table a destination address associated with the one of: 1) the IPv4 address and 2) the IPv6 address.

According to a yet further embodiment of the present invention, the first stage result comprises an address pointer indexing a lookup table in a second one the M pipelined memory stages.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
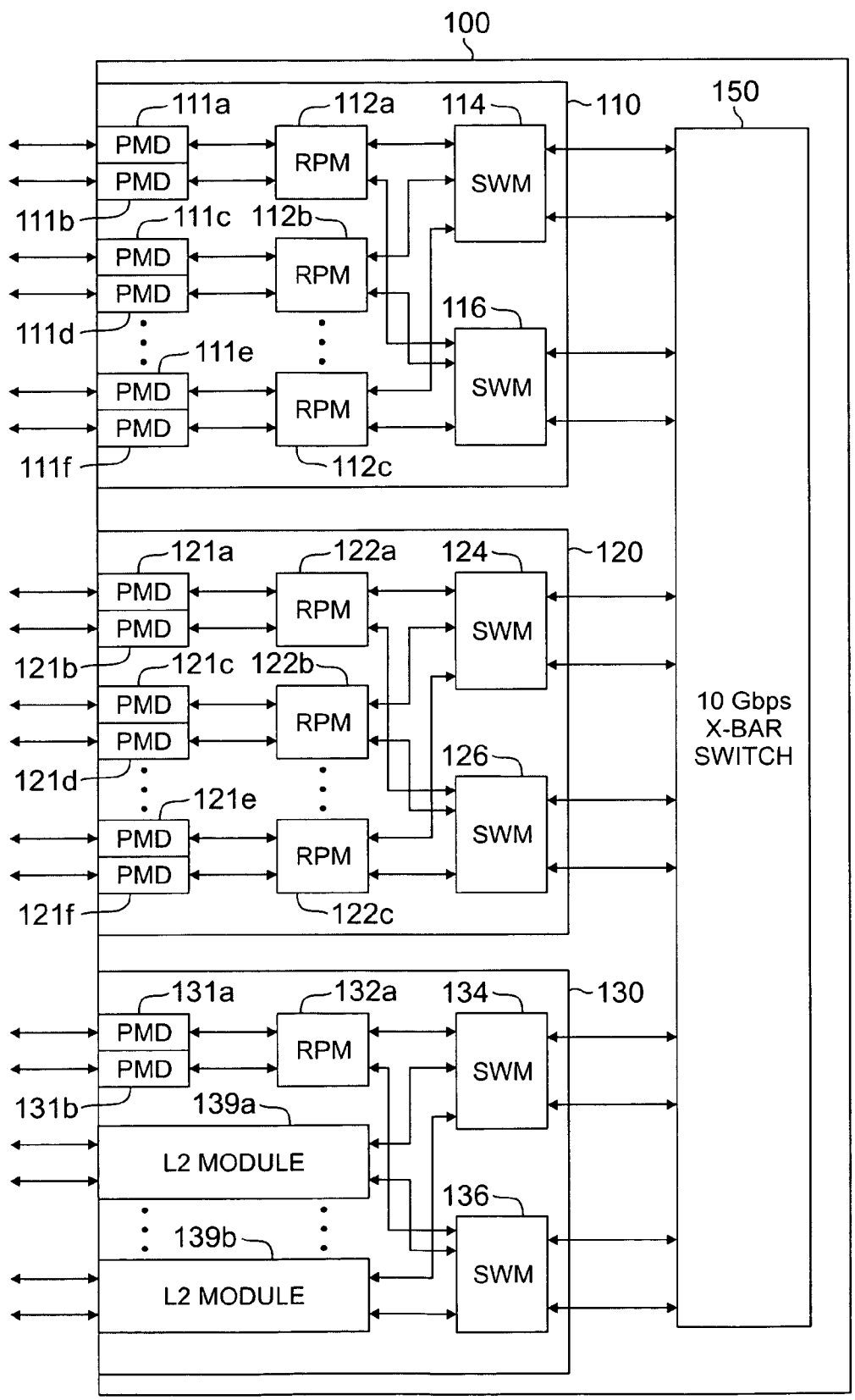
FIG. 1 illustrates an exemplary distributed architecture router that forwards mixed data packet types at high-speed line rates according to the principles of the present invention.
Figure 2:
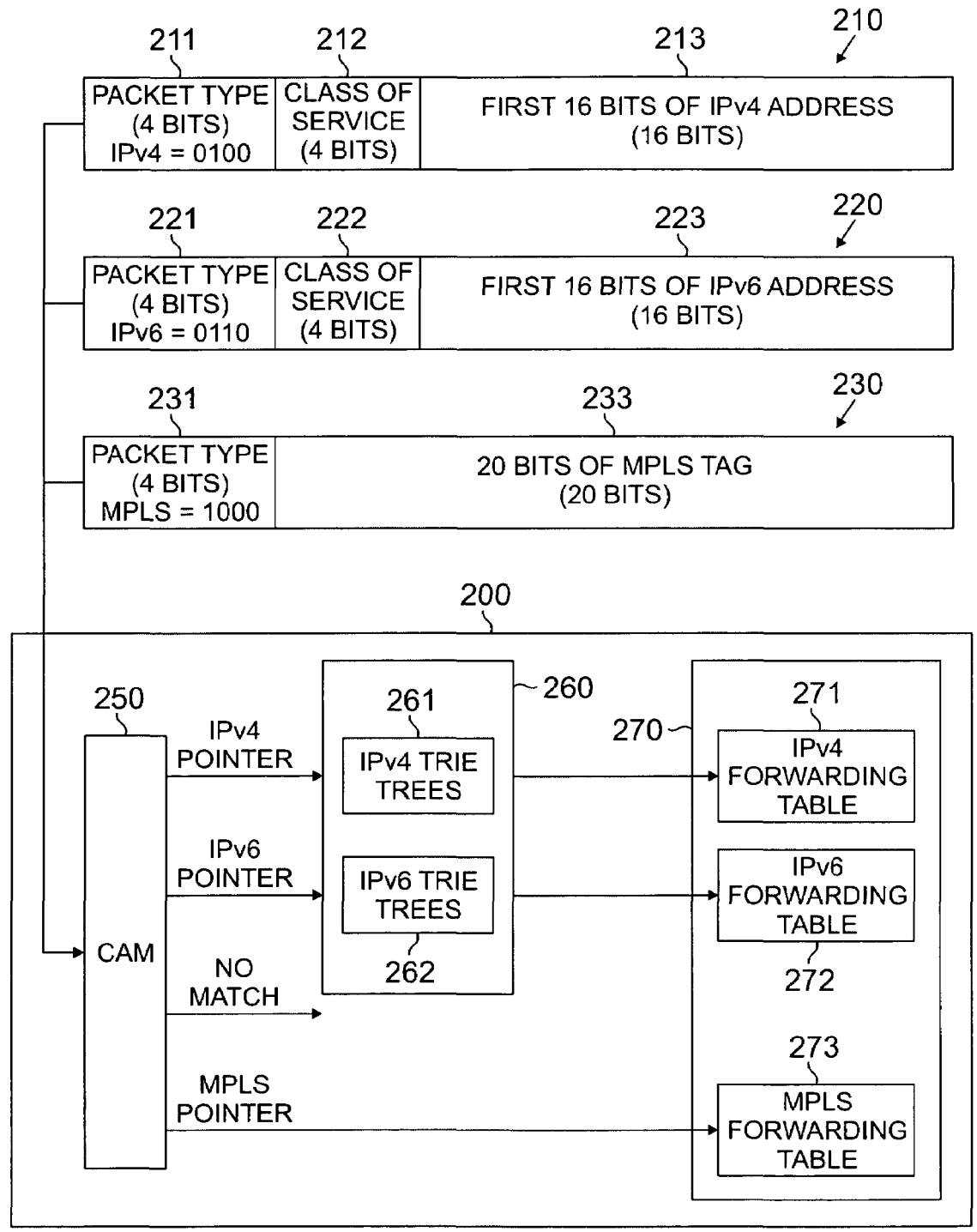
FIG. 2 illustrates selected portions of a routing table search circuit in greater detail according to an exemplary embodiment of the present invention.
Figure 3A:
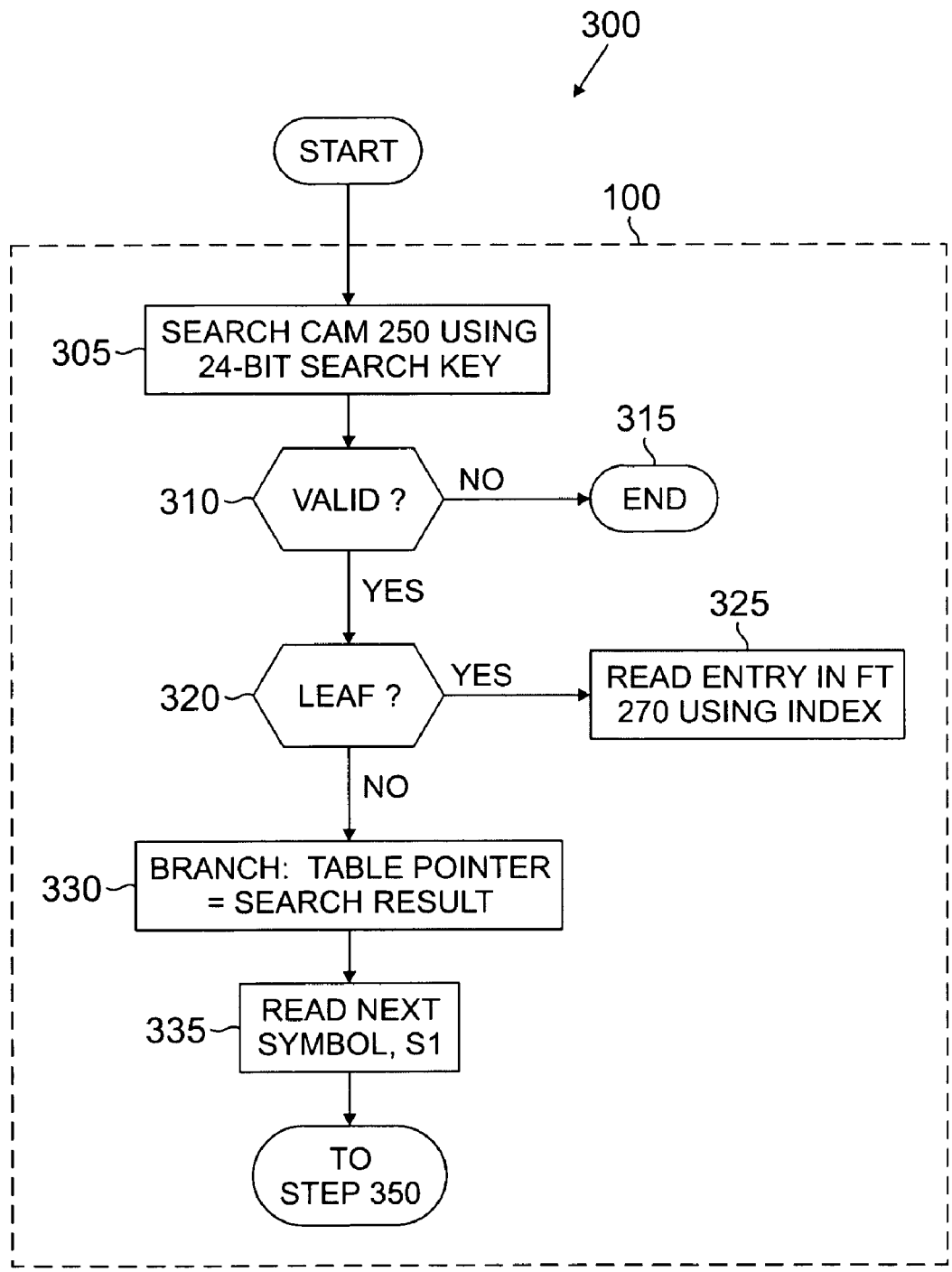
FIG. 3 is a flow diagram illustrating the operation of a routing table search circuit according to the principles of the present invention.
Figure 3B:
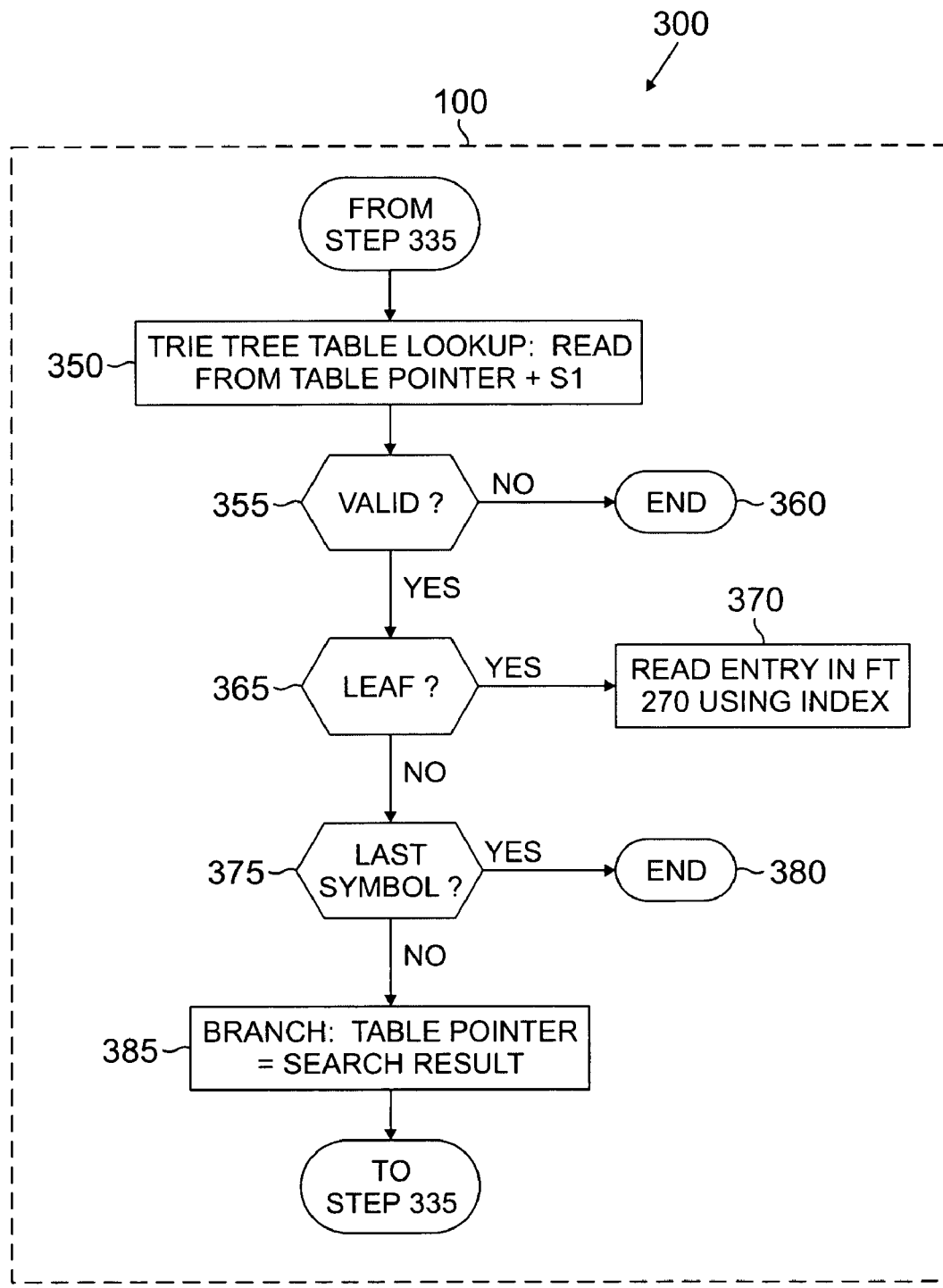

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged distributed packet switch or router.

FIG. 1 illustrates exemplary distributed architecture switch (or router) 100 (hereafter, simply "router 100"), which forwards mixed data packet types (e.g., IPv4, IPv6) at high-speed line rates (e.g., 10 gigabits per second) according to the principles of the present invention. According to the exemplary embodiment, router 100 comprises N rack-mounted shelves, including exemplary shelves 110, 120, and 130, that are coupled via crossbar switch 150. In an advantageous embodiment, crossbar switch 150 is a 10 Gigabit Ethernet (10 GbE) crossbar operating at 10 gigabits per second (Gbps) per port.

Each of exemplary shelves 110, 120 and 130 may comprise route processing modules (RPMs) or Layer 2 (L2) modules, or a combination of route processing modules and L2 modules. Route processing modules forward data packets using primarily Layer 3 information (e.g., Internet protocol (IP) addresses). L2 modules forward data packets using primarily Layer 2 information (e.g., medium access control (MAC) addresses). In the exemplary embodiment shown in FIG. 1, only shelf 130 is shown to contain both route processing (L3) modules and L2 modules. However, this is only for the purpose of simplicity in illustrating router 100. Generally, it should be understood that many, if not all, of the N shelves in router 100 will comprise both RPMs and L2 modules.

Exemplary shelf 110 comprises a pair of redundant switch modules, namely primary switch module (SWM) 114 and secondary switch module (SWM) 116, a plurality of route processing modules 112, including exemplary route processing module (RPM) 112a, RPM 112b, and RPM 112c, and a plurality of physical media device (PMD) modules 111, including exemplary PMD modules 111a, 111b, 111c, 111d, 111e, and 111f. Each PMD module 111 transmits and receives data packets via a plurality of data lines connected to each PMD module 111.

Similarly, shelf 120 comprises a pair of redundant switch modules, namely primary SWM 124 and secondary SWM 126, a plurality of route processing modules 122, including RPM 122a, RPM 122b, and RPM 122c, and a plurality of physical media device (PMD) modules 121, including PMD modules 121a-121f. Each PMD module 121 transmits and receives data packets via a plurality of data lines connected to each PMD module 121.

Additionally, shelf 130 comprises redundant switch modules, namely primary SWM 134 and secondary SWM 136, route processing module 132a, a plurality of physical media device (PMD) modules 131, including PMD modules 131a and 131b, and a plurality of Layer 2 (L2) modules 139, including L2 module 139a and L2 module 139b. Each PMD module 131 transmits and receives data packets via a plurality of data lines connected to each PMD module 131. Each L2 module 139 transmits and receives data packets via a plurality of data lines connected to each L2 module 139.

Router 100 provides scalability and high-performance using up to M independent routing nodes (RN). A routing node comprises, for example, a route processing module (RPM) and at least one physical medium device (PMD) module. A routing node may also comprise an L2 module (L2M). Each route processing module or L2 module buffers incoming Ethernet frames, Internet protocol (IP) packets and MPLS frames from subnets or adjacent routers. Additionally, each RPM or L2M classifies requested services, looks up destination addresses from frame headers or data fields, and forwards frames to the outbound RPM or L2M. Moreover, each RPM (or L2M) also maintains an internal routing table determined from routing protocol messages, learned routes and provisioned static routes and computes the optimal data paths from the routing table. Each RPM processes an incoming frame from one of its PMD modules. According to an advantageous embodiment, each PMD module encapsulates an incoming frame (or cell) from an IP network (or ATM switch) for processing in a route processing module and performs framing and bus conversion functions.

Incoming data packets may be forwarded within router 100 in a number of different ways, depending on whether the source and destination ports are associated with the same or different PMD modules, the same or different route processing modules, and the same or different switch modules. Since each RPM or L2M is coupled to two redundant switch modules, the redundant switch modules are regarded as the same switch module. Thus, the term "different switch modules" refers to distinct switch modules located in different ones of shelves 110, 120 and 130.

In a first type of data flow, an incoming data packet may be received on a source port on PMD module 121f and be directed to a destination port on PMD module 131a. In this first case, the source and destination ports are associated with different route processing modules (i.e., RPM 122c and RPM 132a) and different switch modules (i.e., SWM 126 and SWM 134). The data packet must be forwarded from PMD module 121f all the way through crossbar switch 150 in order to reach the destination port on PMD module 131a.

In a second type of data flow, an incoming data packet may be received on a source port on PMD module 121a and be directed to a destination port on PMD module 121c. In this second case, the source and destination ports are associated with different route processing modules (i.e., RPM 122a and RPM 122b), but the same switch module (i.e., SWM 124). The data packet does not need to be forwarded to crossbar switch 150, but still must pass through SWM 124.

In a third type of data flow, an incoming data packet may be received on a source port on PMD module 111c and be directed to a destination port on PMD module 111d. In this third case, the source and destination ports are associated with different PMD modules, but the same route processing module (i.e., RPM 112b). The data packet must be forwarded to RPM 112b, but does not need to be forwarded to crossbar switch 150 or to switch modules 114 and 116.

Finally, in a fourth type of data flow, an incoming data packet may be received on a source port on PMD module 111a and be directed to a destination port on PMD module 111a. In this fourth case, the source and destination ports are associated with the same PMD module and the same route processing module (i.e., RPM 112a). The data packet still must be forwarded to RPM 112a, but does not need to be forwarded to crossbar switch 150 or to switch modules 114 and 116.

According to the principles of the present invention, the route processing modules and the L2 modules in router 100 use forwarding tables (or routing tables) to forward incoming data packets towards their destinations. The present invention accomplishes this by means of a multi-stage routing table that combines a first stage content addressable memory (CAM) and pipelined stages of trie tree lookup tables to forward mixed packet types at high-speed line rates.

FIG. 2 illustrates selected portions of routing table search circuit 200 in greater detail according to an exemplary embodiment of the present invention. A routing table search circuit similar to routing table search circuit 200 is associated with each of the route processing modules in the N shelves of router 100. Routing table search circuit 200 comprises content addressable memory (CAM) 250, pipelined trie tree lookup tables 260, and forwarding tables 270.

Pipelined trie tree lookup tables 260 comprise IPv4 trie tree lookup tables 261 and IPv6 trie tree lookup tables 262. Lookup tables 261 and 262 represent logical tables, rather than distinct hardware devices. In reality, IPv4 trie tree lookup tables 261 and IPv6 trie tree lookup tables 262 are part of the same multi-stage pipelined memory structure.

In a similar manner, forwarding tables 270 comprise IPv4 forwarding table 271, IPv6 forwarding table 272, and MPLS forwarding table 273. IPv4 forwarding table 271, IPv6 forwarding table 272, and MPLS forwarding table 273 represent logical tables, rather than distinct hardware devices. In reality, IPv4 forwarding table 271, IPv6 forwarding table 272, and MPLS forwarding table 273 are distinct groups of table entries in forwarding tables 270.

According to an advantageous embodiment of the present invention, pipelined trie tree lookup tables 260 and forwarding tables 270 may be implemented in a multi-threaded, parallel processing architecture. Alternatively, the trie tree lookup process may be implemented in the same manner as the trie-based pipelined routing table disclosed in U.S. patent application Ser. No. 10/658,977. Thus, in an exemplary embodiment, pipelined trie tree lookup tables 260 comprise a series of pipelined SRAM stages that output address pointers to subsequent SRAM stages and to forwarding tables 270. The inputs to each SRAM stage are, for example, 4 bits of the data packet address and an address pointer from a previous SRAM stage.

Also, in the exemplary embodiment, forwarding tables 270 comprise DRAM devices containing a plurality of route table entries. The route table entries are indexed by the address pointers output from pipelined trie tree lookup tables 260. Each route table entry may comprise, for example an Output port, a Destination MAC address, a Destination IP address, an IP mask, the Next Hop Gateway, and the like.

The present invention performs a space-folding algorithm that uses CAM 250 to find either 1) a routing table entry in forwarding table 270, or 2) a starting point in IPv4 trie tree lookup tables 261 or in IPv6 trie tree lookup tables 262. Trie tree lookup tables 261 and 262 then complete the search.

The different protocol types (IPv4, IPv6, MPLS) have different length routing addresses. An IPv4 address is 32 bits long, an IPv6 address is 128 bits long, and an MPLS address is 20 bits long. The first step in the address resolution process is to build a search key from the address bits and other information in the data packet header to use as the CAM lookup index. The index may be any size. However, in an exemplary embodiment of the present invention, a 24-bit search key is used.

The search key is composed of fields that separate the address space by packet type and Class of Service (CoS) and of address fields that contain part or all of the routing address. According to an exemplary embodiment, the first nibble (i.e., 4 bits) of the key is a Packet Type field that indicates the type of address resolution to perform (i.e., IPv4, IPv6, or MPLS). By way of example, it is assumed that the Packet Type field for MPLS is set to 8 (1000 binary), the Packet Type field for IPv4 is set to 4 (0100 binary), and the Packet Type field for IPv6 is set to 6 (0110 binary).

FIG. 2 illustrates exemplary IPv4 search key 210, exemplary IPv6 search key 220, and exemplary MPLS search key 230. Each of search keys 210, 220 and 230 comprises 24 bits. IPv4 search key 210 comprises Packet Type field 211 (4 bits), Class of Service (CoS) field 212 (4 bits), and address field 213 (16 bits). IPv6 search key 220 comprises Packet Type field 221 (4 bits), Class of Service (CoS) field 222 (4 bits), and address field 223 (16 bits). MPLS search key 230 comprises Packet Type field 231 (4 bits) and address field 233 (20 bits).

For an MPLS data packet, address field 233 immediately follows Packet Type field 231 and contains the entire 20-bit MPLS tag. For IPv4 and IPv6, the first 2 bytes (16-bits) of the routing address are used as the lower 16 bits of the search key. This leaves 4 bits. These remaining 4 bits (i.e., CoS fields 212 and 222) are available for other purposes. In an advantageous embodiment of the present invention, these four bits are used for routing IPv4 and IPv6 packets based on Class of Service (CoS). If CoS based routing is not desired, CoS fields 212 and 222 may be set to a default value (e.g., 0000).

As noted above, the 24-bit search keys 210, 220 and 230 are used for an initial (i.e., first stage) lookup operation in CAM 250. This lookup could be done as a normal table lookup, but CAM 250 is used to improve efficiency. For IPv4 and IPv6 data packets, the result of the initial lookup (i.e., the output of CAM 250) gives the starting point for a search of trie tree lookup tables 260 that uses the rest of the IPv4 or IPv6 address bits to find the correct entry in forwarding tables 270.

For MPLS data packets, all of the address bits are used to search in CAM 250, so the result of the initial search directly gives the correct entry in forwarding tables 270. However, in an alternate embodiment, where less than all of the MPLS address bits are used to search CAM 250, the output of CAM 250 plus the remaining MPLS address bits may be used to search trie tree lookup tables 260 to find the correct entry in forwarding tables 270.

The address resolution value may be found by direct index referenced into an array of $2^{24}$ (16,777,216) address resolution references, instead of through the CAM lookup. If the address points into a 32 bit address space, then the direct reference array would require $2^{26}$ (67,108,864) bytes of memory. This is a large amount of memory, especially considering that the memory is expensive, high-speed memory with severe board layout constraints.

The initial address resolution table also must be able to distinguish between valid address resolution values and those entries that do not indicate a valid search key. Normally, a special value either null (zeros) or −1 (all bits set) in the corresponding address resolution table is used to indicate an irresolvable address reference (i.e., "No Match"). Using CAM 250 in the initial search stage significantly reduces the memory requirements from the direct reference approach. In addition, CAM 250 has the ability to indicate an irresolvable entry without the need to initialize each element. This simplifies and speeds up system initialization.

FIG. 3 depicts flow diagram 300, which illustrates the operation of routing table search circuit 200 according to the principles of the present invention. Initially, the 24-bit search key is used to perform the first stage lookup in CAM 250 (process step 305). For an invalid address, no match is found in CAM 250 and the search ends (process steps 310 and 315).

For a valid MPLS address, or an IPv4 or IPv6 subnet whose length is less than or equal to sixteen, the output of CAM 250 is an address pointer that indexes directly into a table entry in MPLS forwarding table 273, IPv4 forwarding table 271, or IPv6 forwarding table 272 in forwarding tables 270 (process steps 320 and 325). Otherwise, the output of CAM 250 is an address pointer pointing to the first stage (N=1) of trie tree lookup tables 260 (process steps 320 and 330). The width of the CAM result must be at least as wide as the width of the address of the table space and for efficiency typically will be the same as the table address width. Each unique CAM result points to a different tree structure in trie tree lookup tables 260.

The output of CAM 250 and the first 4-bit symbol are added to form an index into the first stage of trie tree lookup tables 260 and the entry is read (process steps 335 and 350). If the entry read in process step 350 is for an invalid address, no match is found in the first stage of trie tree lookup tables 260 and the search ends (process steps 355 and 360). If the entry read in process step 350 is a leaf associated with a valid IPv4 or IPv6 address, then the output of the first stage of trie tree lookup tables 260 is an address pointer that indexes a table entry in either IPv4 forwarding table 271 or IPv6 forwarding table 272 in forwarding tables 270 (process steps 365 and 370).

If the entry read in process step 350 points to a branch in trie tree lookup tables 260, then the output of the first stage of trie tree lookup tables 260 is an address pointer that indexes another lookup table in the second stage of trie tree tables 260. At this point, the search performed in the first stage is repeated in the second stage and each subsequent stage until the last 4-bit symbol of the address is consumed (process steps 375 and 385). If the last symbol is consumed and no leaf has been reached (i.e., no match found) then the search ends (process step 380).

As noted, a search ends when either all symbols are consumed or when a leaf in trie tree lookup tables 260 is reached. The result from the Nth stage of trie tree lookup tables 260 may be a branch or a leaf. A branch leads to another search table in the next stage. A leaf leads to either an address pointer to an entry in forwarding tables 270 or an invalid search result (No Match) indicating that the search string is not known. The subnet mask is used when constructing the tables to define the leaf locations. A status is generated giving the number of nibbles in the longest match.

A flag or a special lookup value (e.g., −1 or 111 . . . 11) may be used to indicate an unknown entry. A flag may be used to indicate whether a table entry is a branch or a leaf. This flag may be incorporated into the normal table entry (e.g., it possible to start all branches on even byte boundaries and all leafs on odd byte boundaries). An alternate embodiment may divide the address space between tree tables and forwarding table entries and use upper address bits to distinguish between them. In another embodiment, flags may be included in each lookup table to indicate whether each lookup entry is a leaf or a branch. An advantageous embodiment of the present invention adds another item to each lookup table that includes one flag for each lookup table entry. The lookup table in each stage of trie tree lookup tables 260 has 16 flags.

In the exemplary embodiment, the address width is 32 bits and nibbles (4 bits) are used for symbols. Thus, the CAM 250 lookup results in a 32-bit address pointer that points to the start of a trie tree in trie tree lookup tables 260 or to an entry in forwarding tables 270. For MPLS data packets, the CAM 250 result points to an entry in forwarding tables 270 or indicates an unknown entry ("No Match"). For IPv4 data packets, there are 16 address bits that are not consumed by CAM 250, so up to another four symbols must be processed in trie tree lookup tables 260. For IPv6 data packets, there are 112 address bits that are not consumed by CAM 250, so up to another 28 symbols must be processed in trie tree lookup tables 260. As explained above, searches for IPv4 and IPv6 data packets terminate: 1) after consumption of all bits; 2) at an early leaf node determined by the subnet mask that contains a forwarding table entry; or 3) when an undefined entry is reached indicating No Match. Since a nibble can have sixteen values, the Nth stage of trie tree lookup tables 260 has 16 entries for each lookup table indexed by an address pointer from the previous stage.

Advantageously, the present invention uses only a small amount of CAM, so that the power consumption and expense are kept within practical limits. Use of CAM 250 for the first stage lookup eliminates the need to pre-initialize the table with invalid search entries and reduces the memory utilization of the first stage lookup. The search table sizes are kept under control and the required lookup speeds are achieved by the combination of hashing, digital search trees, and pipelining.

The unification of the routing of mixed packet types, such as IPv4, IPv6, and MPLS, leads to reduced hardware and memory requirements compared to previous methods that used separate forwarding engines and forwarding processes with independent forwarding tables for each packet type. This method of unification of mixed packet types and CoS based forwarding is scalable to higher data rates than the prior art because it is not limited by the performance and expense of existing classification engines.

Although the present invention has been described with an exemplary embodiment, various changes and modifications may be suggested to one skilled in the art. It is intended that the present invention encompass such changes and modifications as fall within the scope of the appended claims.

What is claimed is:

1. For use in a router, a routing table search circuit for determining a first forwarding address for a first received data packet comprising:
   a forwarding table comprising a plurality of forwarding table entries, each of said forwarding table entries comprising a forwarding address;
   a content addressable memory (CAM) capable of receiving a search key and outputting a CAM search result corresponding to said search key, wherein said search key comprises at least: 1) a packet type field associated with said first received data packet and 2) an address field containing a most significant bits portion of a first received address associated with said first received data packet;
   M pipelined memory stages for storing a trie table capable of translating header information in said first received data packet into a pipelined memory output, using said CAM search result and a remaining bits portion of said first received address when said first received data packet comprises a first packet type; and
   wherein said pipelined memory output corresponds to a pointer indexing a forwarding table entry comprising said first forwarding address when said first received data packet comprises said first packet type and wherein said CAM search result corresponds to said pointer when said first received data packet comprises a second packet type.

2. The routing table search circuit as set forth in claim 1 wherein said packet type field indicates if said first received address corresponds to one of an MPLS tag, an IPv4 address and an IPv6 address.

3. The routing table search circuit as set forth in claim 2 wherein said search key further comprises a class of service (CoS) field indicating a class of service for said first received data packet.

4. The routing table search circuit as set forth in claim 3 wherein said most significant bits portion of said first received address comprises at least a portion of an MPLS tag.

5. The routing table search circuit as set forth in claim 4 wherein said CAM search result accesses in said forwarding table a forwarding address corresponding to said MPLS tag.

6. The routing table search circuit as set forth in claim 3 wherein said most significant bits portion of said first received address comprises at least a portion of one of: 1) an IPv4 address and 2) an IPv6 address.

7. The routing table search circuit as set forth in claim 6 wherein a first stage result associated with a first one of said M pipelined memory stages accesses in said forwarding table a forwarding address associated with said one of: 1) said IPv4 address and 2) said IPv6 address.

8. The routing table search circuit as set forth in claim 6 wherein a first stage result associated with a first one of said M pipelined memory stages comprises an address pointer indexing a lookup table in a second one of said M pipelined memory stages.

9. A router for interconnecting N interfacing peripheral devices, said router comprising:
   a switch fabric; and
   a plurality of routing nodes coupled to said switch fabric, each of said routing nodes comprising a routing table search circuit determining a first forwarding address for a first received data packet, said routing table search circuit comprising:
   a forwarding table comprising a plurality of forwarding table entries, each of said forwarding table entries comprising a forwarding address;
   a content addressable memory (CAM) capable of receiving a search key and outputting a CAM search result corresponding to said search key, wherein said search key comprises at least: 1) a packet type field associated with said first received data packet and 2) an address field containing a most significant bits portion of a first received address associated with said first received data packet;
   M pipelined memory stages for storing a trie table capable of translating header information in said first received data packet into a pipelined memory output using said CAM search result and a remaining bits portion of said first received address when said first received data packet comprises a first packet type; and wherein said pipelined memory output corresponds to a pointer indexing a forwarding table entry comprising said first forwarding address when said first received data packet comprises said first packet type and wherein said CAM search result corresponds to said pointer when said first received data packet comprises a second packet type.

10. The router as set forth in claim 9 wherein said packet type field indicates if said first received address corresponds to one of an MPLS tag, an IPv4 address and an IPv6 address.

11. The router as set forth in claim 10 wherein said search key further comprises a class of service (CoS) field indicating a class of service for said first received data packet.

12. The router as set forth in claim 11 wherein said most significant bits portion of said first received address comprises at least a portion of an MPLS tag.

13. The router as set forth in claim 12 wherein said CAM search result accesses in said forwarding table a forwarding address corresponding to said MPLS tag.

14. The router as set forth in claim 11 wherein said most significant bits portion of said first received address comprises at least a portion of one of: 1) an IPv4 address and 2) an IPv6 address.

15. The router as set forth in claim 14 wherein a first stage result associated with a first one of said M pipelined memory stages accesses in said forwarding table a forwarding address associated with said one of: 1) said IPv4 address and 2) said IPv6 address.

16. The router as set forth in claim 14 wherein a first stage result associated with a first one of said M pipelined memory stages comprises an address pointer indexing a lookup table in a second one of said M pipelined memory stages.

17. For use in a routing node of a router, a method for determining a first forwarding address associated with a first received data packet the method comprising the steps of:

receiving the first received data packet and generating therefrom a search key, the search key comprising at least: 1) a packet type field associated with the first received data packet and 2) an address field containing a most significant bits portion of a first received address associated with said first received data packet;

inputting the search key to a content addressable memory (CAM) comprising a CAM lookup table;

accessing a CAM search result corresponding to the search key in the CAM lookup table and outputting the CAM search result from the CAM;

if the first received address is an MPLS tag, accessing an entry in a forwarding table using the CAM search result, wherein the forwarding table comprises a plurality of forwarding table entries and each forwarding table entry comprises a forwarding address; and if the first received address is one of an IPv4 address and an IPv6 address, (i) applying the CAM search result to M pipelined memory stages storing a trie tree table capable of translating the first received address into a pipelined memory output using the CAM search result and a remaining bits portion of the first received address and (ii) accessing an entry in the forwarding table using the pipelined memory output.

18. The method as set forth in claim 17 wherein the packet type field indicates if the first received address corresponds to one of an MPLS tag, an IPv4 address and an IPv6 address.

19. The method as set forth in claim 18 wherein the search key further comprises a class of service (CoS) field indicating a class of service for a data packet associated with the first received address.

20. The method as set forth in claim 19 wherein the most significant bits portion of the first received address comprises at least a portion of an MPLS tag.

21. The method as set forth in claim 20 wherein the CAM search result accesses in the forwarding table a forwarding address corresponding to the MPLS tag.

22. The method as set forth in claim 19 wherein the most significant bits portion of the first received address comprises at least a portion of one of: 1) an IPv4 address and 2) an IPv6 address.

23. The method as set forth in claim 22 wherein a first stage result associated with a first one of the M pipelined memory stages accesses in the forwarding table a forwarding address associated with the one of: 1) the IPv4 address and 2) the IPv6 address.

24. The method as set forth in claim 22 wherein a first stage result associated with a first one of the M pipelined memory stages comprises an address pointer indexing a lookup table in a second one of the M pipelined memory stages.

* * * * *